(12) United States Patent
Murakami

(10) Patent No.: US 6,352,026 B1
(45) Date of Patent: Mar. 5, 2002

(54) SCREEN PRINTING APPARATUS FOR PRINTING LAYERS HAVING DIFFERENT THICKNESSES

(75) Inventor: Takehiko Murakami, Inagi (JP)

(73) Assignee: Minami Co., Ltd, Tokyo (JP)

(*) Notice: Subject to any disclaimer, the term of this patent is extended or adjusted under 35 U.S.C. 154(b) by 0 days.

(21) Appl. No.: 09/633,481

(22) Filed: Aug. 7, 2000

(30) Foreign Application Priority Data

Aug. 31, 1999 (JP) ............................................. 11-245093

(51) Int. Cl.[7] .............................. B41L 13/02; B41M 1/12
(52) U.S. Cl. ....................... 101/127; 101/123; 101/114; 118/213
(58) Field of Search ................................. 101/114, 123, 101/124, 127, 128.21, 128.4, 129; 118/213, 406, 301

(56) References Cited

U.S. PATENT DOCUMENTS

| | | | |
|---|---|---|---|
| 4,638,733 A | * 1/1987 | Schneider et al. | 101/114 |
| 4,930,413 A | * 6/1990 | Jaffa | 101/126 |
| 5,681,387 A | * 10/1997 | Schmidt | 118/105 |
| 5,704,286 A | * 1/1998 | Takashima | 101/127 |
| 5,740,730 A | * 4/1998 | Thompson, Sr. | 101/127 |
| 5,813,331 A | * 9/1998 | Tan | 101/129 |
| 6,096,131 A | * 8/2000 | Hewett | 118/504 |
| 6,272,984 B1 | * 8/2001 | Kato et al. | 101/129 |

FOREIGN PATENT DOCUMENTS

JP 63-166593 * 7/1988 ................. 101/127

* cited by examiner

*Primary Examiner*—Leslie J. Grohusky
(74) *Attorney, Agent, or Firm*—R. Neil Sudol; Henry Coleman; William Sapone

(57) ABSTRACT

A screen printing apparatus for applying a printing agent in different thicknesses to a plate. A mask of the apparatus has a width corresponding to or matching the widths of two plates to be printed. A first portion of the mask, for applying a first printing to the plate, is reduced by recessing an upper surface of the mask portion, with screen holes being provided therein pursuant to a desired pattern. A second portion of the mask, for applying a second printing to the plate, is provided with screen holes in a different pattern. Recesses are provided in the lower surface of the second portion of the mask for receiving the printing agent applied via the first portion of the mask, thereby preventing the printing agent from attaching to the second portion of the mask. A single printing operation, on two plates disposed side by side, is performed by moving a squeegee having two portions with different thicknesses or heights. The plate to be printed can be shifted under the lower surface of the mask.

1 Claim, 2 Drawing Sheets

SCREEN PRINTING APPARATUS FOR PRINTING LAYERS HAVING DIFFERENT THICKNESSES

BACKGROUND OF THE INVENTION

1. Field of the Invention

The present invention relates to a screen printing apparatus, and more particularly to a screen printing apparatus which is structured such that a printing agent can be applied to one plate to be printed by one apparatus so as to have different thicknesses.

2. Description of the Prior Art

For example, when bonding a conductive body to a printed circuit board, it is necessary to thinly apply a printing agent to a narrow or small conductive body and thickly apply the printing agent to a thick or wide conductive body.

Then, in the case of applying the printing agent to one printed circuit board at different thicknesses, the printing agent application is conventionally performed by two apparatuses in two independent stages. That is, at first, the printing agent is thinly applied by a first apparatus and next, is thickly applied by a second apparatus, and vice versa.

However, in the case that two apparatuses having quite the same structure are used, a lot of cost is required and a placing space is necessarily increased.

SUMMARY OF THE INVENTION

The present invention is made by taking the points mentioned above into consideration, and an object of the present invention is to provide a screen printing apparatus which is structured such that a printing agent can be applied to one plate to be printed by one apparatus so as to have different thicknesses.

Then, in accordance with a gist of the present invention, there is provided a screen printing apparatus comprising:

a mask having a width corresponding to two plates to be printed and structured such that a thickness of a portion applying a first printing to the plate to be printed is reduced by recessing the upper surface of the portion to a desired depth, screen holes are provided in the portion in accordance with a desired pattern, screen holes are provided in a portion opposite to the portion in accordance with a different pattern from that of the first said screen holes, and a recess for preventing a printing agent applied by the screen holes provided in a side to which the first printing is applied from being attached is provided in a lower surface; and a squeegee separated into a portion moving along the portion of the mask in the side to which the first printing is to be applied, and a portion moving along the opposite portion, having different heights and integrally moving both of the portions, with respect to one plate to be printed, after a printing is applied with the portion of the mask in the side to which the first printing is to be applied, a printing is applied to the other side.

DESCRIPTION OF THE PREFERRED EMBODIMENT

A description will be given below of an embodiment in accordance with the present invention with reference to the accompanying drawings.

Figure 1:
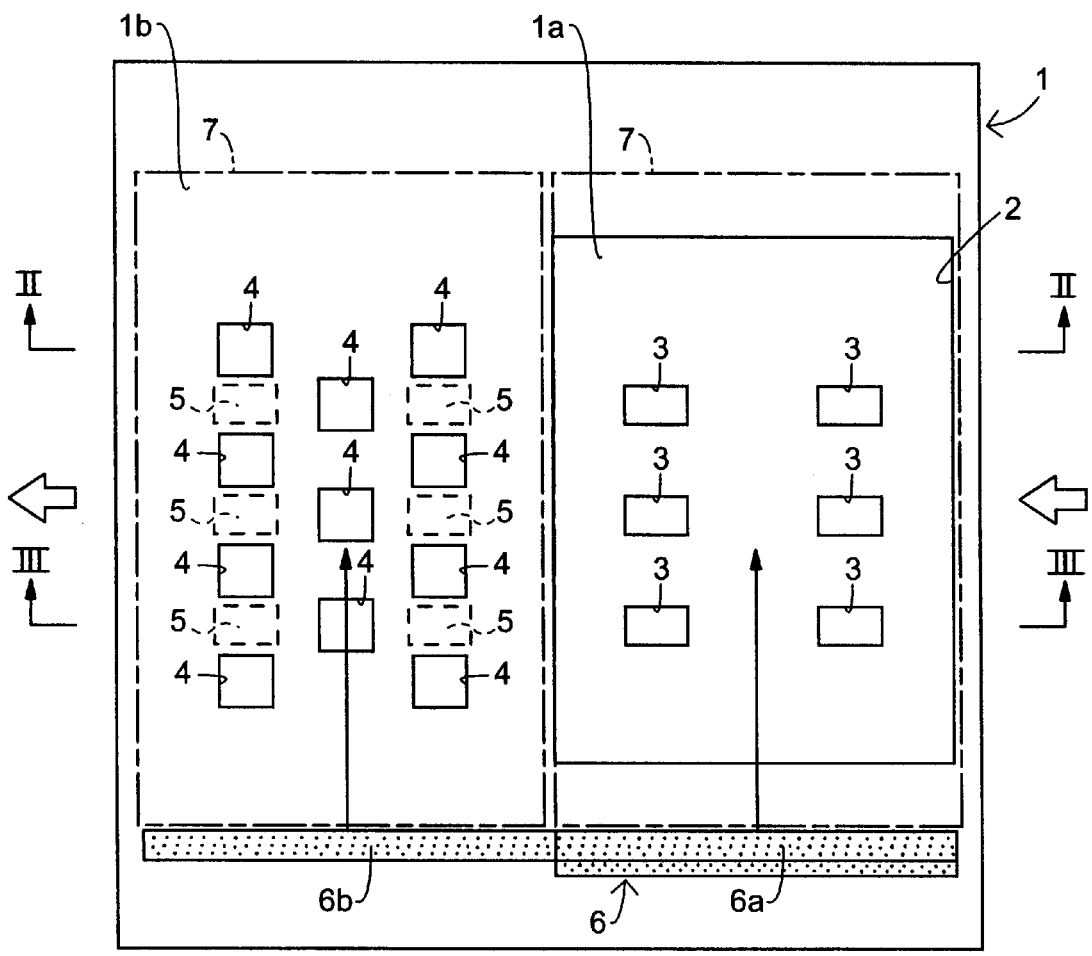
FIG. 1 is a plan view of a mask and a squeegee in accordance with the present invention.
Figure 2:
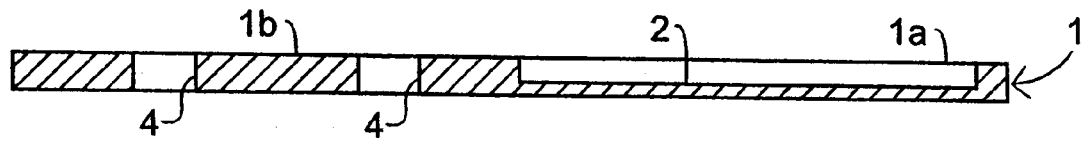
FIG. 2 is a cross sectional view taken along a line II—II in FIG. 1.
Figure 3:
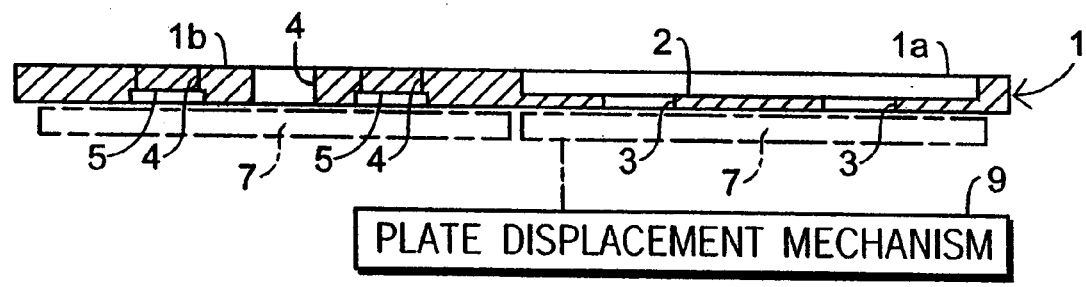
FIG. 3 is a cross sectional view taken along a line III—III in FIG. 1.
Figure 4:
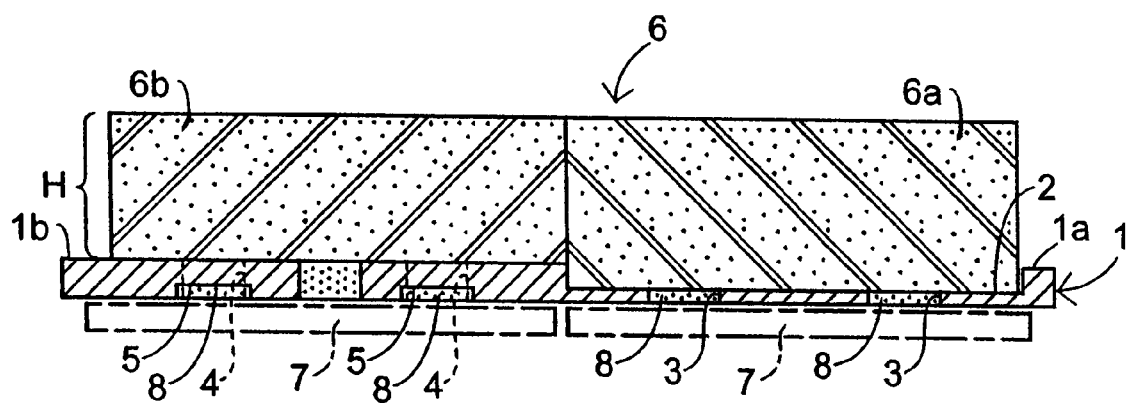
FIG. 4 is a view explaining an operation in accordance with the present invention.

FIG. 1 is a plan view of a mask and a squeegee, FIG. 2 is a cross sectional view taken along a line II—II in FIG. 1, FIG. 3 is a cross sectional view taken along a line III—III in FIG. 1 and FIG. 4 is a view explaining an operation.

In the drawings, reference numeral 1 denotes a mask in a screen printing apparatus. Further, the mask 1 has a width corresponding to two plates to be printed, a thickness of a portion 1a in a side to which a printing is first applied to the plate to be printed is reduced by recessing the upper surface of the portion 1a to a desired depth, and screen holes 3 are provided in the portion 1a in accordance with a desired pattern. In this case, reference numeral 2 denotes a recess.

Further, on the other hand, screen holes 4 are provided in a portion 1b opposite to the portion 1a in accordance with a different pattern from that of the screen holes 3, and a recess 5 for preventing a printing agent applied by the screen holes 3 provided in the portion 1a from being attached is provided in the lower surface. In this case, a material for printing on a printed circuit board such as a creamed solder or the like can be used for the printing agent.

Reference numeral 6 denotes a squeegee. In this case, the squeegee is structured such as to be separated into a portion 6a moving along the portion 1a of the mask 1 in the side to which the first printing is to be applied, and a portion 6b moving along the opposite portion 1b, have a different heights H and integrally move both of the portions 6a and 6b.

Further, the present invention is structured such that one plate to be printed can be shifted so that after a printing is applied with the portion 1a of the mask 1 in the side to which the first printing is to be applied, a printing is applied to the other side, by using the mask 1 and the squeegee 6. In this case, the shift operation may be performed by proper means 9.

A description will be further given of an operation of the present invention in particular. A plate to be printed is fed in a direction of an arrow in FIG. 1 with respect to the mask 1. Here, in the present embodiment, there is shown the case that the plate to be printed is a printed circuit board 7 and a printing agent 8 is applied thereto.

The printed circuit board 7 in a state that the printing agent 8 is already applied to the portion 1a with which the first printing is to be applied is set to the lower surface of the portion 1b opposite to the side to which the first printing is to be applied in the mask 1, and the printed circuit board 7 to which the printing agent is not yet applied is set to the lower surface of the portion 1a in the side to which the first printing is to be applied.

When moving the squeegee 6 in this state, the printing agent 8 is thinly applied to the printed circuit board 7 set on the lower surface of the portion 1a of the mask 1 in the side to which the first printing is to be applied, via the screen holes 3, and the printing agent is thickly applied to the printed circuit board 7 set on the lower surface of the portion 1b in the other side of the mask 1, via the screen holes 4. In this case, since the screen holes 3 and the screen holes 4 have different length and accordingly have different capacity, the thickness of the applied printing agent becomes different.

Further, when applying the printing agent 8 to the printed circuit board 7 set on the lower surface of the portion 1b in the opposite side to the side to which the first printing is to be applied in the mask 1, the already thinly applied printing agent 8 enters into the recess and is not attached to the mask 1.

Thereafter, an application of the printing agent is performed by moving the printed circuit board 7 on the lower surface of the portion 1a of the mask 1 in the side to which the first printing is to be applied to the lower surface of the portion 1b in another side, setting the next printed circuit board 7 to a space formed in accordance with this movement and moving the squeegee 6 in the same manner as mentioned above. Accordingly, it is possible to apply the printing agent to one plate to be printed by one apparatus so as to have different thicknesses.

Since the present invention has the structure and operation as mentioned above, it is possible to apply the printing agent to one plate to be printed by one apparatus so as to have different thicknesses. Accordingly, it is possible to solve the conventional problems in the cost and the placing space caused by the fact that two apparatuses having quite the same structure are used.

What is claimed is:

1. A screen printing apparatus comprising:

(a) a mask having a width corresponding to a combined width of a first and a second plate to be printed, the mask including a first section having an area corresponding to the first plate to be printed in a given step of a printing process and the second section having an area corresponding to a second plate to be printed in the given step, the first section including a recess formed on an upper surface thereof, the recess having a predetermined depth and screen holes disposed in a first pattern, the second section including screen holes disposed therein in a second pattern different from the first pattern, the second section being provided on a lower surface thereof with agent-attachment-prevention recesses having a preselected depth;

(b) a squeegee including a first portion of a first length corresponding to a width of the first section of the mask and a second portion of a second length corresponding to a width of the second section of the mask, the first portion being set to be greater in height than the second portion, the first and second portions being displaced integrally in a direction perpendicular to a width direction of the plates to be printed; and (c) a mechanism for successively displacing the first and second plates to be printed by a distance corresponding to a width of a single plate of the plates to be printed in the width direction of the plates.

\* \* \* \* \*